United States Patent [19]
Maesaka et al.

[11] Patent Number: 5,875,099
[45] Date of Patent: Feb. 23, 1999

[54] ELECTRONIC COMPONENT

[75] Inventors: Michinobu Maesaka, Omihachiman; Tetsuo Tatsumi, Itami; Masato Higuchi, Moriyami, all of Japan

[73] Assignee: Murata Manufacturing Co., Ltd., Kyoto-fu, Japan

[21] Appl. No.: 82,873

[22] Filed: May 21, 1998

Related U.S. Application Data

[63] Continuation-in-part of Ser. No. 853,447, May 9, 1997.

[30]      Foreign Application Priority Data

May 9, 1996   [JP]   Japan ................................. 8-140860

[51] Int. Cl.⁶ ...................................................... H05K 1/18
[52] U.S. Cl. .......................... 361/760; 361/762; 361/763; 361/818; 361/728; 361/736; 361/737; 310/344; 310/348; 310/366; 333/186-192; 331/73
[58] Field of Search ..................................... 361/760, 307, 361/753, 724, 728, 736, 737, 762, 763, 767, 777, 779, 783, 774, 746, 818; 310/320, 344, 348, 365, 366, 311, 318, 319, 340; 333/187–192, 186; 331/73

[56]                References Cited

U.S. PATENT DOCUMENTS

| | | | |
|---|---|---|---|
| 4,586,110 | 4/1986 | Yamamoto | 361/307 |
| 4,901,203 | 2/1990 | Kobayashi et al. | 361/737 |
| 5,382,929 | 1/1995 | Inao et al. | |
| 5,585,687 | 12/1996 | Wakabayashi et al. | 310/366 |
| 5,699,027 | 12/1997 | Tsuji et al. | 333/193 |
| 5,712,523 | 1/1998 | Nakashima et al. | 310/313 R |

*Primary Examiner*—Leo P. Picard
*Assistant Examiner*—David Foster
*Attorney, Agent, or Firm*—Graham & James LLP

[57]              ABSTRACT

An electronic component suppresses stray capacitance and exhibits a high electromagnetic shielding effect, and eliminates flowing of a conductive agent into inappropriate areas and occurrence of a poor electrical connection. Electronic-component devices are mounted on an insulating substrate having input and output electrodes and a ground electrode. Then, a metallic cap is bonded and sealed onto the substrate via an insulating layer having holes formed therein so as to cover the electronic-component devices. A conductive layer connected to the ground electrode is disposed on part of the cap-mounting portion of the substrate and positioned at a level higher than the insulating layer so that the metallic cap is electrically connected via the conductive layer to the ground electrode.

8 Claims, 6 Drawing Sheets

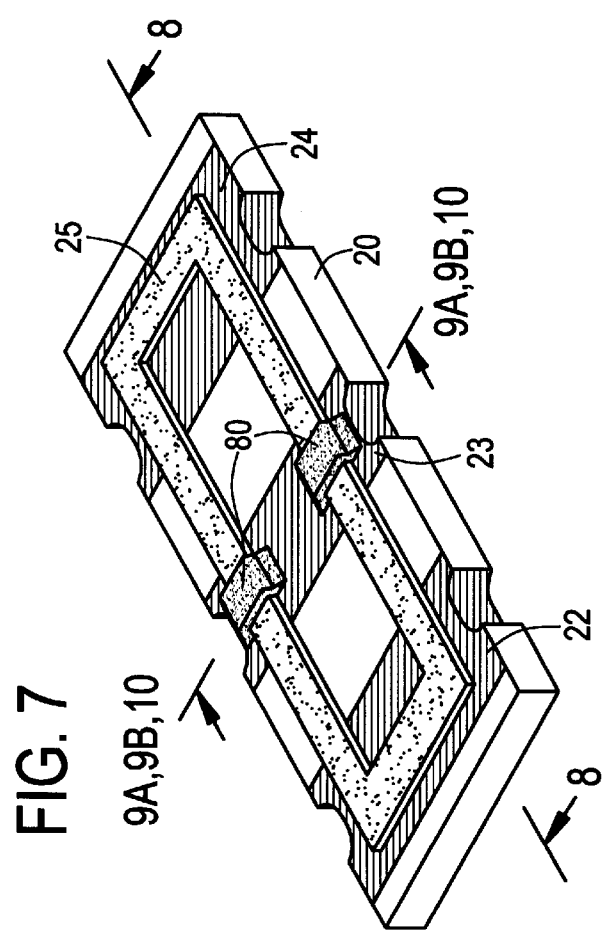
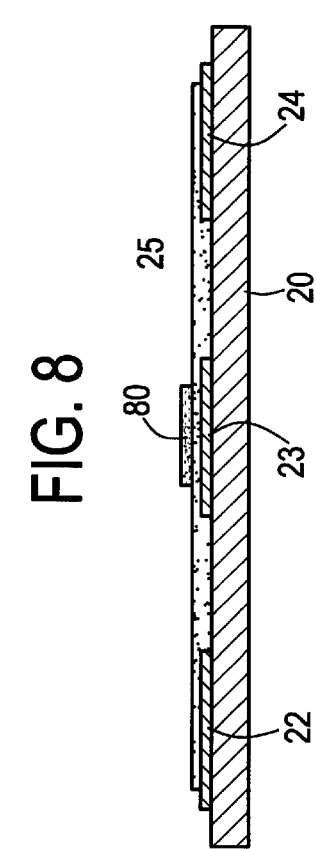
FIG. 9A
FIG. 9B
FIG. 7
FIG. 8

ELECTRONIC COMPONENT

This application is a Continuation-in-Part of U.S. Pat. application Ser. No. 081853,447, filed on May 9, 1997, currently pending.

BACKGROUND OF THE INVENTION

1. Field of the Invention

The present invention relates generally to electronic components and, more particularly, to surface mount-type electronic components.

2. Description of the Related Art

A surface mount-type electronic component previously developed by the present inventor is a piezoelectric component illustrated in FIG. 1. This piezoelectric component is a capacitor-integrating piezoelectric oscillator having one oscillator R and two capacitors $C_1$, and $C_2$ for use in a Colpitts oscillator circuit. The electric circuit of this component is shown in FIG. 2.

Referring to FIG. 1, this piezoelectric component includes an insulating substrate 20, an oscillator device 40, a capacitor device 50, and a metallic cap 60. The substrate 20 is a substantially rectangular thin sheet preferably made from alumina ceramics, and three band-like electrodes 22, 23 and 24 are preferably provided on the upper surface of the substrate 20 and arranged substantially parallel to the widthwise direction of the substrate 20. The electrodes 22, 23 and 24 serve as an input electrode, a ground electrode and an output electrode, respectively. Both ends of the electrodes 22 through 24 respectively extend to recesses or through-holes 20a formed on the side edge surfaces of the substrate 20 and are connected to the electrodes disposed on the lower surface of the substrate 20 via the electrodes formed on the inner surfaces of the recesses 20a.

A frame-shaped insulating layer 25 preferably made from a resin base paste or a glass base paste is provided on the top portion of the substrate 20 on which the cap 60 is bonded. The thickness of the insulating layer 25 is desirably determined to be within a range, for example, from about 20 to 40 μm, in order to reduce a level difference or difference in vertical height or location created by the electrodes and also to sufficiently insulate the electrodes from the cap 60 which will be explained in greater detail below. The insulating layer 25 is baked or cured after it has been printed.

Bonded onto the substrate 20 is a laminated block formed by integrating the oscillator device 40 and the capacitor device 50 via materials 30 through 32 which have both conducting and adhering functions, such as a conductive adhesive.

The oscillator device 40 is a thickness shear vibration-mode device in which an electrode 42 is disposed to cover an area beginning at a first end of the device 40 and extending about two thirds along a length of a top surface of a piezoelectric ceramic substrate 41 while an electrode 43 is disposed to cover an area beginning at a second end of the device 40 and extending approximately two thirds of a length of a bottom surface of the substrate 41. The inner ends of the electrodes 42 and 43 overlap each other at the intermediate portion of the device 40 across the piezoelectric substrate 41 so as to form a vibrating section. The outer ends 42a and 43a of the electrodes 42 and 43 are routed in a roundabout manner to the bottom surface of the piezoelectric substrate 41 via the respective edge surfaces of the substrate 41.

Moreover, the capacitor device 50 has a dielectric substrate 51 (for example, a ceramic substrate) preferably having the same length and width as the oscillator device 40. Two individual electrodes 52 and 53 are disposed on a top surface of the dielectric substrate 51 so as to extend from both ends towards a center portion of the substrate 51, while one opposing electrode 54 is provided on a bottom surface of the substrate 51 to opposedly face the individual electrodes 52 and 53. Two capacitors $C_1$, and $C_2$ are formed in the opposing portion between the opposing electrode 54 and the individual electrodes 52 and 53. The outer ends 52a and 53a of the electrodes 52 and 53 are routed in a roundabout fashion to the bottom surface of the substrate 51 via the respective edge surfaces of the substrate 51.

The bottom surface of the oscillator device 40 and the top surface of the capacitor device So are bonded at both ends via materials 33 and 34 having-both conducting and adhering functions, such as a conductive adhesive. Simultaneously, a space for vibration can be formed between the vibrating section of the oscillator device 40 and the capacitor device 50 by virtue of the thickness of the materials 33 and 34. In this manner, one electrode 42 of the oscillator device 40 and one individual electrode 52 of the capacitor device 50 are connected, while the other electrode 43 of the oscillator device 40 and the other individual electrode 53 of the capacitor device 50 are coupled. It should be noted that resin-containing, frequency-adjusting damping materials 35 and 36 are applied onto both ends of the top surface of the oscillator device 40.

After the oscillator device 40 and the capacitor device 50 are integrally attached to each other, the bottom surface of the capacitor device 50 is bonded onto the substrate 20 via materials 30 through 32. Then, the outer end 52a of one individual electrode 52 of the capacitor device 52 is connected to the input electrode 22; the outer end 53a of the other individual electrode 53 is coupled to the output electrode 24; and the opposing electrode 54 is connected to the ground electrode 23.

The cap 60 is fixed at its opening onto the substrate 20 with an adhesive 61 to cover the oscillator device 40 and the capacitor device 50. The adhesive 61, which is preferably an epoxy-type adhesive, is applied to the bottom surface of the opening of the cap 60 which is then bonded to the insulating layer 25. Then, the adhesive 61 is cured.

In the piezoelectric component described above using the metallic cap 60, it may be preferred to that the cap 60 is electrically grounded in order to inhibit stray capacitance and to shield electric noise entering from the exterior.

As one of the methods for grounding the cap 60, the following technique is available. After the cap 60 is attached to the substrate 20, a conductive paste 70 is applied with a dispenser, as shown in FIG. 3, to connect the outer surface of the cap 60 to the ground electrode 23 of the substrate 20, thereby establishing an electrical connection between the cap 60 and the ground electrode 23.

However, this method presents the following problems. The application of the conductive paste 70 with a dispenser is time-consuming, and also, additional work, i.e., the application of the paste 70, is required after the piezoelectric component has been completed, thereby lowering productivity. Further, the adhesive 61 forms a fillet or bump seen in FIGS. 4 and 5 on the exterior of the cap 60 to bond the cap 60 to the substrate 20, and it is necessary that the conductive paste 70 be applied to a position or vertical level higher than the fillet in order to electrically connect the cap 60 to the ground electrode 23. It is very difficult, however, to apply the paste 70 to a position higher than the fillet while preventing the paste 70 from flowing into the recessed portion 20a of the substrate 20. In practice, the conductive paste 70 flows into the recessed portion 20a, as illustrated in FIG. 4, to disadvantageously lower solderability and create a poor electrical connection between the cap 60 and the substrate 20, as shown in FIG. 5.

SUMMARY OF THE INVENTION

To overcome the problems discussed above, the preferred embodiments of the present invention provide an electronic component which significantly suppresses stray capacitance and produces a high electromagnetic shielding effect, and eliminates problems such as flowing of a conductive agent into an inappropriate area, reduces the amount of adhesive required and eliminates occurrence of a poor electrical connection.

According to the preferred embodiments of the present invention, there is provided an electronic component including an insulating substrate having an input electrode, an output electrode, and a ground electrode; an electronic-component device mounted on the insulating substrate; and a cap bonded and sealed onto the insulating substrate via an rag insulating layer to cover the electronic-component device, the insulating layer including openings provided therein, wherein a conductive layer connected to the ground electrode is disposed on part of a cap-mounting portion of the substrate and positioned at a level or vertical position higher than the insulating layer, so that the cap is electrically connected to the conductive layer.

The openings formed in the insulating layer are preferably interior openings which are surrounded on all sides by the insulating layer material such that the insulating layer is a continuous member instead of being separate members.

Conductive paste is preferably located in the openings of the insulating layer. Because of the openings being surrounded on all sides by insulating material, the conductive paste provided in the openings is reliably and accurately located therein and does not flow out of the openings or outside of the insulating layer. In addition, the openings and conductive paste in the insulating layer are located such that the adhesive for bonding the cap to the substrate is located at areas surrounding the openings. As a result of this arrangement, less adhesive may be used and more reliably positioned for more secure bonding of the cap to the substrate.

More specifically, the cap is preferably bonded onto the insulating layer of the substrate on which the electronic-component devices are mounted. At this time, when the cap is pressed on to the substrate, the uncured adhesive applied to the opening of the cap is squeezed out due to the presence of the conductive layer located on the ground electrode so as to positively connect the cap to the conductive layer because the conductive layer is disposed at a level or vertical position higher than the insulating layer. Thus, the cap is electrically connected to the ground electrode via the conductive layer. In this state, the adhesive can be cured to seal the cap to the substrate.

The insulating layer may be formed to define a frame-shaped member which includes openings formed therein and which is preferably disposed on the cap-mounting portion of the substrate. Then, the conductive layer may be disposed to extend across the portion of the insulating layer disposed on the ground electrode. In this case, the conductive layer may be applied onto the insulating layer according to a known method, such as printing, thereby simplifying the formation of the conductive layer.

The insulating layer is preferably a frame-shaped member and the openings formed therein are preferably located in the insulating layer at various positions including, for example, positions corresponding to the location of the ground electrode on the substrate. Then, the conductive layer may be disposed on the ground electrode at positions corresponding to the openings of the insulating layer and formed to have a greater thickness than the insulating layer. In this case, the frame-shaped member is defined by both the conductive layer and the insulating layer, thereby preventing the conductive layer from projecting out from the capmounting portion.

The electronic component devices included in the preferred embodiments of the present invention may comprise a piezoelectric device having first and second electrodes. The first and second electrodes may be respectively connected to the input and output electrodes of the substrate.

Alternatively, the electronic-component devices may comprise a piezoelectric device and a capacitor device bonded to each other. In this case, first and second electrodes may be disposed on the piezoelectric device, and two individual electrodes respectively connected to the first and second electrodes of the piezoelectric device may be disposed on one main surface of the capacitor electrode, while an opposing electrode opposedly facing the individual electrodes may be disposed on the other main surface of the capacitor device. Then, the two individual electrodes of the capacitor device may be respectively connected to the input and output electrodes of the substrate, while the opposing electrode may be coupled to the ground electrode of the substrate. Hence, a capacitor-integrating piezoelectric oscillator for use in a Colpitts oscillator circuit can be obtained.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

FIG. 7 is a perspective view of a substrate used in the electronic component shown in FIG. 6;

FIG. 8 is a cross-sectional view taken along line B—B of FIG. 7;

FIG. 9, which is comprised of FIGS. 9A and 9E, is a cross-sectional view taken along line C—C of FIG. 7 illustrating the cap-bonding operation to electrically connect the cap and the conductive layer;

DETAILED DESCRIPTION OF PREFERRED EMBODIMENTS

Figure 1:
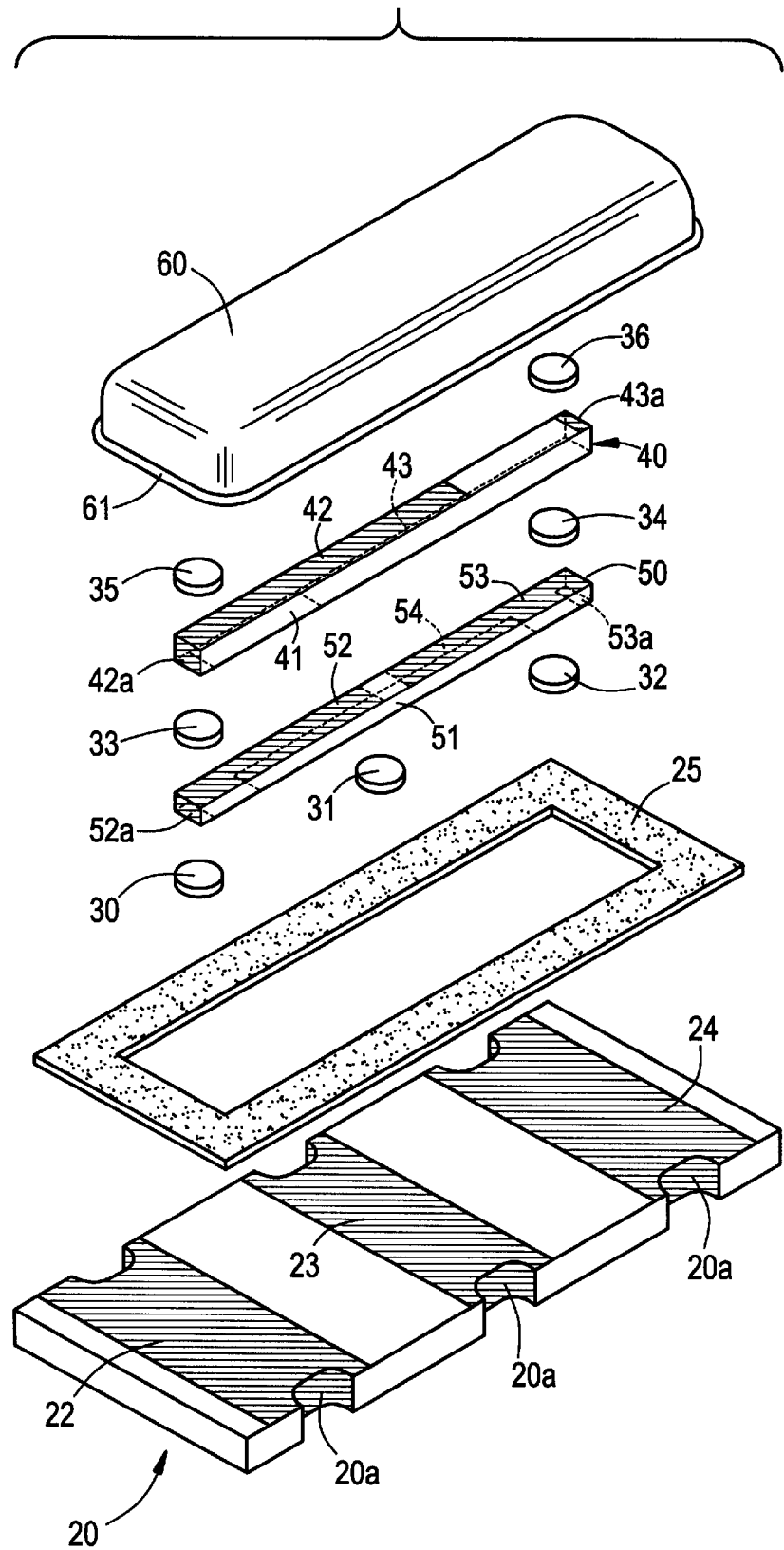
FIG. 1 is an exploded perspective view illustrating an example of known electronic components.
Figure 4:
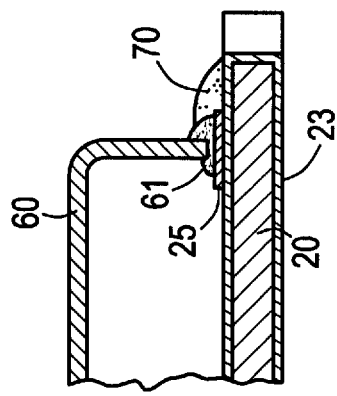
FIG. 4 is a cross-sectional view taken along line A—A of FIG. 3 illustrating the state in which a conductive agent flows into a recessed portion on the side edge of the substrate.
Figure 5:
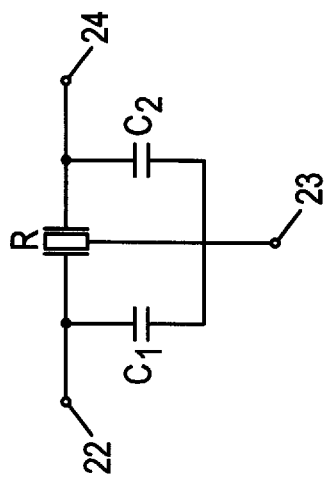
FIG. 5 is a cross-sectional view taken along line A—A of FIG. 3 illustrating a poor electrical connection.
Figure 2:
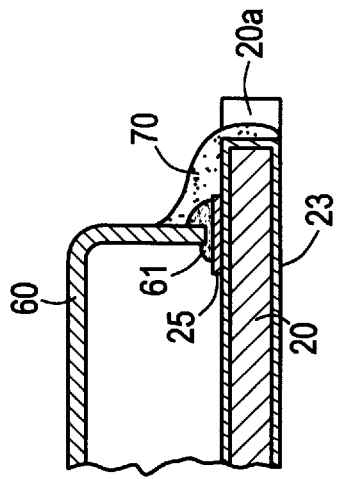
FIG. 2 is an electrical circuit diagram of the electronic component shown in FIG. 1.
Figure 3:
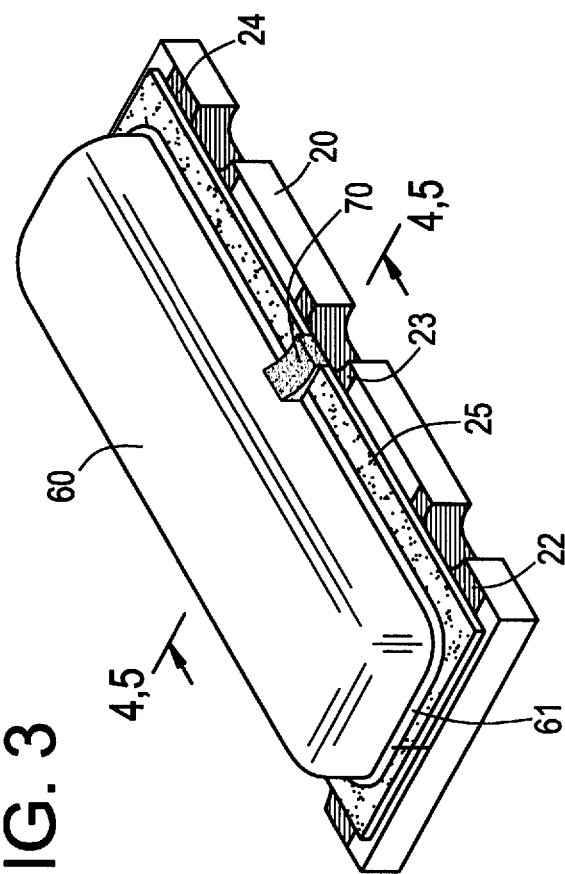
FIG. 3 is a perspective view of the electronic component shown in FIG. 1 when assembled.
Figure 6:
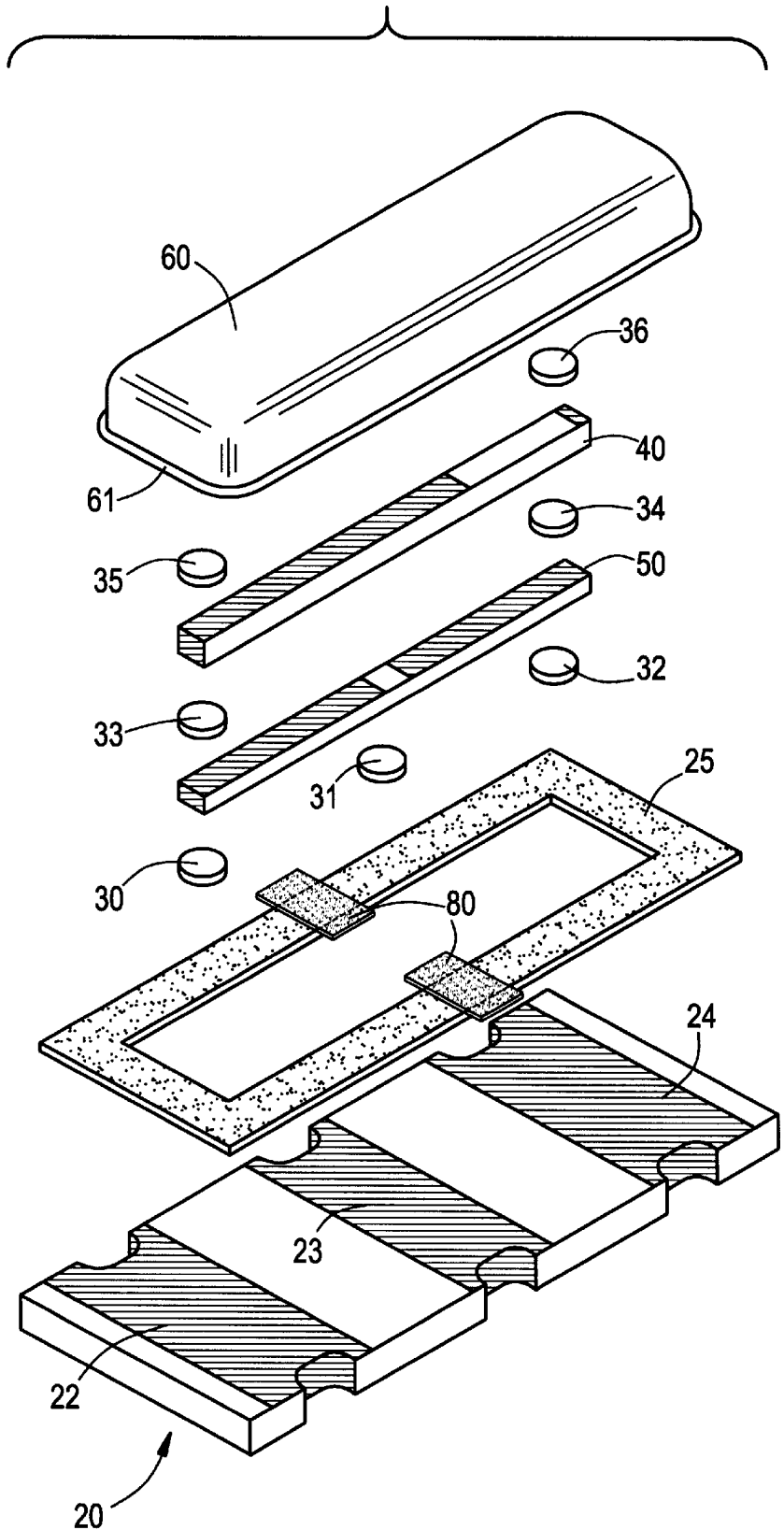
FIG. 6 is an exploded perspective view of an electronic component according to a preferred embodiment of the present invention.

FIG. 6 illustrates an electronic component according to a preferred embodiment of the present invention. This preferred embodiment is a capacitor-integrating piezoelectric oscillator similar to that shown in FIG. 1. Thus, the same elements as those shown in FIG. 1 are designated by like reference numerals, and an explanation thereof will be omitted.

A conductive layer 80 is preferably disposed to extend across the insulating layer 25 at locations corresponding to a location of the ground electrode 23 before the devices 40 and 50 are mounted on the substrate 20. The conductive layer 80 is electrically connected to the ground electrode 23. This conductive layer 80 is preferably produced by applying a conductive paste to have a predetermined thickness (for example, 10 $\mu$m) by processes such as screen printing and curing. Accordingly, the top surface of the conductive layer 80 is located, as illustrated in FIGS. 7 and 8, at a level higher than the top surface of the insulating layer 25.

As the conductive paste, not only a conductive adhesive, but a baking-type silver paste or cream solder may be used. Although in this preferred embodiment, the conductive layer 80 is deposited preferably at two locations on the insulating layer 25, it may be formed on only one location or more than two locations. Moreover, if it is desirable to decrease the thickness of the portion of the insulating layer 25 covered by the conductive layer 80, the portion of the insulating layer 25 disposed on the ground electrode 23 may be formed to have a smaller width.

The conductive layer 80 may be made from the same material as the adhesive 30 through 32 used for fixing the devices 40 and 50, in which case, the conductive layer 80 may be applied simultaneously with the adhesive 30 through 32. This further eliminates an additional process step of applying the conductive layer 80, thereby reducing the number of process steps.

Further, the conductive layer 80 may be continuously formed in a band-like shape with the conductive adhesive 31 used for connecting the opposing electrode 54 of the capacitor device 50 to the ground electrode 23. This reduces the number of coating steps and also simplifies the coating pattern. Additionally, the conductive layer 80 may be formed after the substrate 20 is separated from the multiple substrate assembly. However, a plurality of conductive layers 80 may be formed at one time on the substrate assembly, thereby further enhancing productivity.

An explanation will now be given of an assembly method for a piezoelectric oscillator using the above-described substrate 20, in particular, a method for bonding and sealing the cap 60, with reference to FIG. 9.

After the conductive layer 80 is formed, as shown in FIG. 9A, so as to extend across the insulating layer 25 corresponding to the area on the ground electrode 23, the devices 40 and 50 are mounted on the substrate 20. Then, the metallic cap 60 having the adhesive 61 at its opening is bonded onto the insulating layer 25. Until the adhesive 61 is cured, a pressure of approximately 30 to 100 g for each conductive layer 80 is preferably applied to the cap 60. At this time, a level difference or difference in vertical height locations is created because of the conductive layer 80 being disposed on the insulating layer 25, and when the cap 60 is pressed against the insulating layer 25, a pressurizing force concentrates on the conductive layer 80. Accordingly, the uncured adhesive 61 applied to the bottom surface of the opening of the cap 60 is squeezed out to both ends due to the presence of the conductive layer 80 so as to bring the metallic surface at the opening of the cap 60 into contact with the conductive layer 80. This makes it possible to electrically connect the cap 60 to the ground electrode 23 through the conductive layer 80. In this state, the adhesive 61 is heat-cured to seal the devices 40 and 50 inside the cap 60. It is thus possible to obtain an electronic component which can sufficiently suppress stray capacitance and exhibit a high electromagnetic shielding effect.

If a level difference between the conductive layer 80 and the insulating layer 25 is approximately 10 $\mu$m, the sealing characteristics of the cap 60 are hardly influenced.

In this manner, the conductive layer 80 is formed, not after the electronic component has been completed, but while the component is manufactured, thereby maintaining productivity. It is also possible to prevent a conductive agent from flowing into a through hole or recessed portion formed in the substrate and to ensure a good electrical connection between the cap and the ground electrode.

Figure 10:
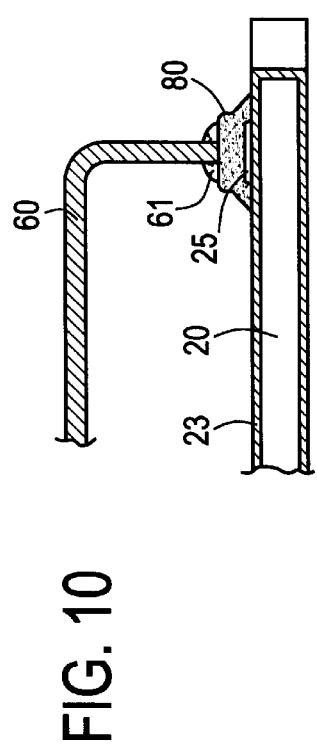
FIG. 10 is a cross-sectional view taken along line C—C of FIG. 7 illustrating a modification of the electrical connection between the cap and the conductive layer shown in FIG. 9.

In FIG. 9, the metallic cap 60 is mounted on the insulating layer 25 after the conductive paste 80 serving as the conductive layer has been cured. However, the cap 60 may be mounted while the conductive paste 80 is not yet cured, as illustrated in FIG. 10. Even though the conductive paste 80 is uncured, it preferably has a generally higher hardness than the adhesive 61 for bonding the cap 60. Accordingly, when the cap 60 is pressurized, the opening of the cap 60 penetrates into the conductive paste 80 while the adhesive 61 is squeezed out, as illustrated in FIG. 10, thereby improving the reliability of an electrical connection between the cap 60 and the conductive paste 80. Thereafter, the paste 80 and the adhesive 61 may be heat-cured at the same time.

Figure 12:
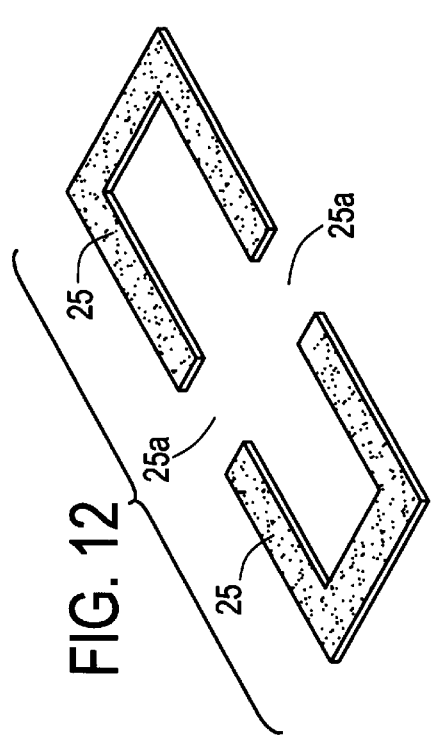
FIG. 12 is a perspective view illustrating the pattern of an insulating layer formed on the substrate shown in FIG. 11.
Figure 13:
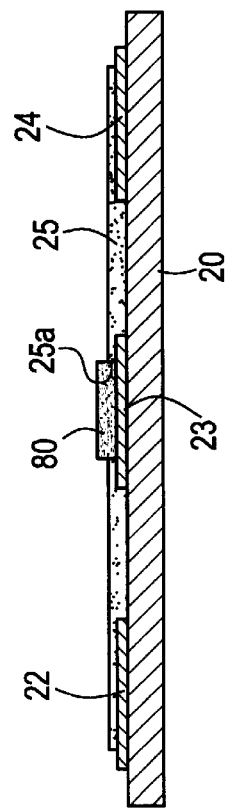
FIG. 13 is a cross-sectional view taken along line D—D of FIG. 11.
Figure 11:
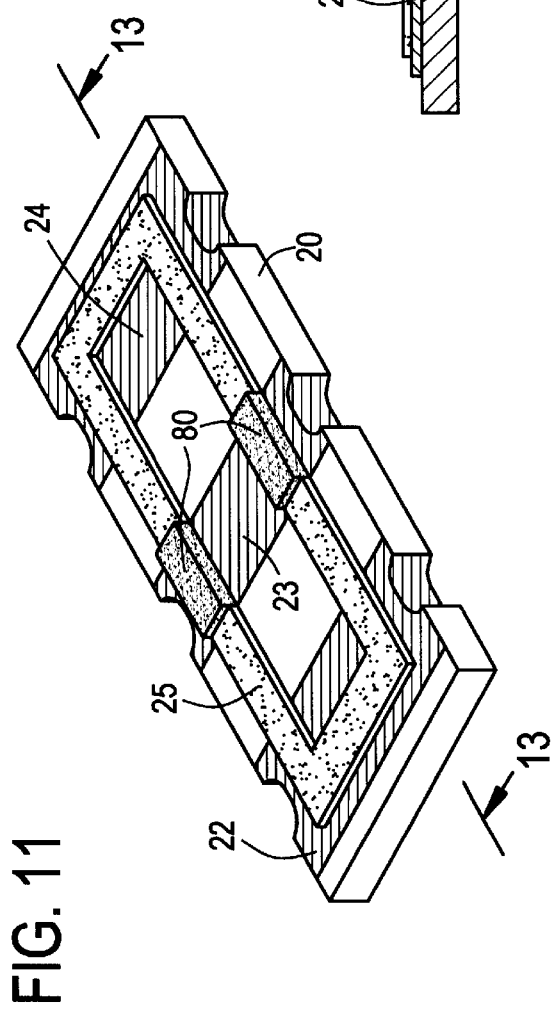
FIG. 11 is a perspective view of a substrate used in an electronic component according to another preferred embodiment of the present invention.

A second preferred embodiment of the present invention will now be described while referring to FIGS. 11 through 13. In this preferred embodiment, the insulating layer 25 has gaps 25a in positions corresponding to the locations of the ground electrode 23, and the conductive paste 80 is provided in the gaps 25a. If the thickness of the conductive paste 80 (for example, 20 to 30 $\mu$m) is larger than that of the insulating layer 25 (for example, 10 to 20 $\mu$m), the conductive paste 80 can be positioned at a level higher than the insulating layer 25, so that the opening of the cap 60 can be positively brought into contact with the conductive paste 80.

Figure 14:
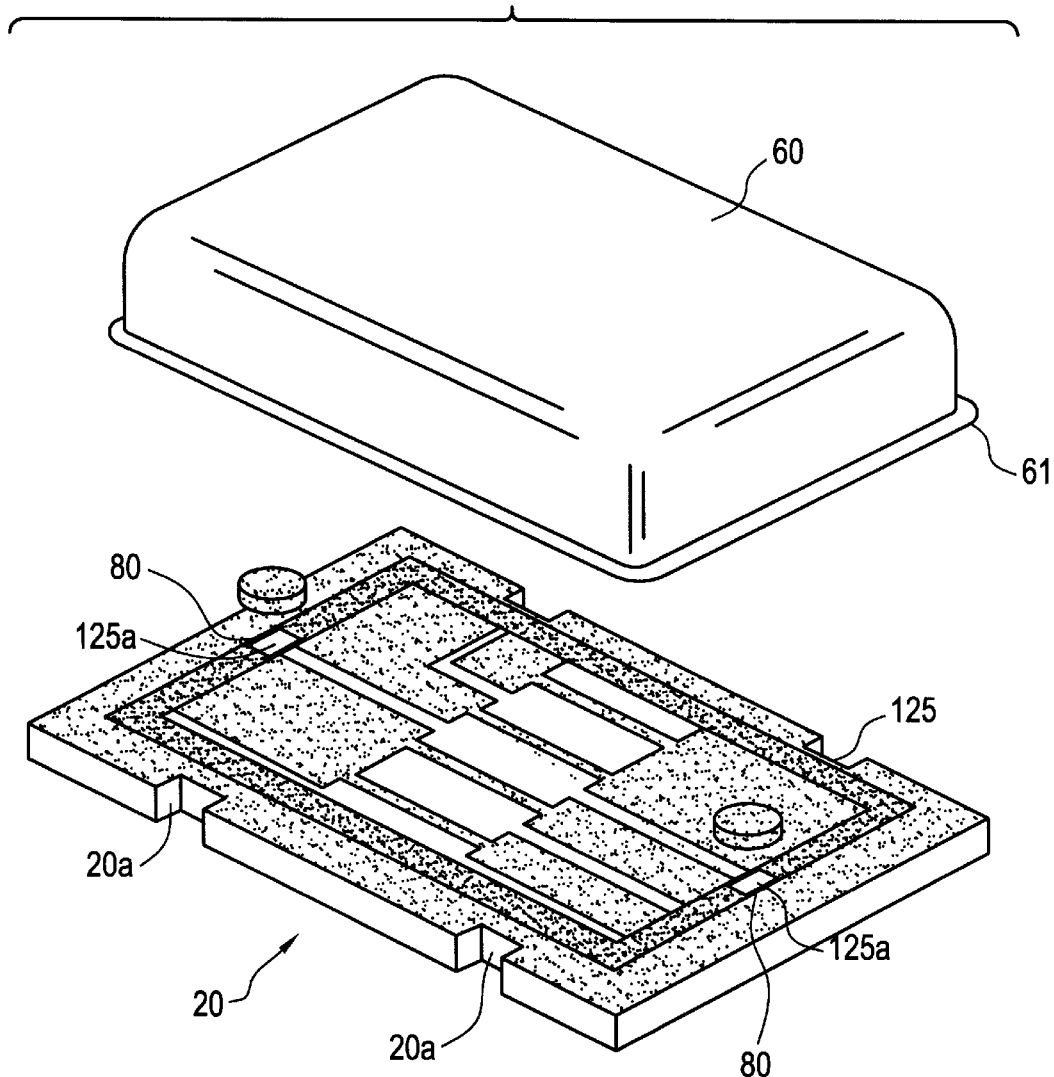
FIG. 14 is a perspective view of an electronic component according to a further preferred embodiment of the present invention.

A third preferred embodiment of the present invention is shown in FIG. 14, wherein like reference numerals indicate like elements shown in FIG. 6. In this preferred embodiment, the insulating layer 125 has openings 125a defined at various positions along the cap-mounting portion of the substrate and may be located at positions corresponding to the locations of the ground electrode 23. The openings 125a may be located such that the conductive paste 80 provided at the location of the ground electrode 23 is located in the openings 125a. The openings 125a are preferably substantially rectangular as shown in FIG. 14 but may have any geometric shape as desired. The openings 125a are preferably constructed such that there are no gaps 25a in the insulating layer 125 as are present in FIG. 12. Instead, as seen in FIG. 14, the openings 125a are preferably surrounded on all sides by the insulating layer 125 and are filled with conductive paste 80. As a result, less adhesive 61 may the used because the adhesive 61 does not have to fill the openings 125a which are already filled with conductive paste 80 unlike the embodiment in FIG. 12 where the adhesive 61 must fill the gaps 25a to secure the sealing of the cap 60 to the substrate 20. In addition, with the openings 125a arranged and filled with conductive paste 80, the adhesive 61 can be more accurately located and permanently positioned at the area surrounding the openings 125a and to prevent undesired flowing of the adhesive 61. As a result of the arrangement of the openings 125a, the amount of adhesive 61 required is substantially reduced because the adhesive 61 does not have to fill the gaps 25a as in FIG. 12 but merely has to fill the relatively small area surrounding the openings 125a. More specifically, because an amount of the adhesive 61 required is less and is located at only the surrounding area of the openings 125a, the adhesive 61 is more controllably applied to better provide adhesion without spilling or flowing of the adhesive 61 into undesired areas.

If the thickness of the conductive paste 80 (for example, 20 to 30 μm) is larger than that of the insulating layer 125 (for example, 10 to 20 μm), the conductive paste 80 can be positioned at a level higher than the insulating layer 125, so that the opening of the cap 60 can be positively brought into contact with the conductive paste 80.

The electronic component of the preferred embodiments of the present invention is not restricted to a capacitor-integrating oscillator having an oscillator device and a capacitor device as disclosed in the above preferred embodiments.

For example, the capacitor device 50 shown in FIG. 6 may be omitted, and the oscillator device 40 may be directly connected to the input and output electrodes 22 and 24 of the substrate 20 via conductive agents 33 and 34, respectively. In this case, a predetermined gap should be provided to avoid an electrical connection between the electrodes 42 and 43 of the oscillator device 40 and the ground electrode 23.

Additionally, instead of using the capacitor device, dielectric layers may be formed on the substrate. Thus, it is possible to provide a capacitor-integrating oscillator having a capacitor on the substrate or using a dielectric substrate. Further, the present invention is applicable to other types of electronic components, such as filters and circuit modules.

As is seen from the foregoing description, the preferred embodiments of the present invention offer the following advantages.

A conductive layer connected to the ground electrode is disposed on part of the cap-mounting portion of the substrate and positioned at a level higher than the insulating layer. Accordingly, the opening of the cap is pressed against the cap-mounting portion to ensure a close and reliable contact between the cap and the conductive layer, thereby reliably establishing an electrical connection therebetween. It is thus possible to provide an electronic component that can sufficiently inhibit stray capacitance and produce a high electromagnetic shielding effect.

Moreover, the conductive layer can be formed according to a known method, such as screen printing, before the cap is mounted. This can eliminate time-consuming additional work, such as the application of a conductive paste with a dispenser after an electronic component is completed, and further, productivity can be maintained. It is also possible to solve the problems suffered by the conventional method, such as flowing of a conductive agent into inappropriate areas and occurrence of a poor electrical connection.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electronic component comprising:
   an insulating substrate having an input electrode, an output electrode, and a ground electrode;
   an electronic component device mounted on said insulating substrate;
   an insulating layer including holes formed therein; and
   a cap bonded and sealed onto said insulating substrate via said insulating layer such that the cap covers said electronic-component device, wherein a conductive layer connected to said ground electrode is disposed on part of a said substrate and positioned at a level higher than said insulating layer, such that said cap is electrically connected to said conductive layer.

2. An electronic component according to claim 1, wherein the holes formed in the insulating layer are each surrounded by portions of the insulating layer such that the insulating layer comprises a single, continuous layer.

3. An electronic component according to claim 1, wherein an adhesive is located in said holes of said insulating layer.

4. An electronic component according to claim 1, wherein said holes in said insulating layer are substantially rectangular.

5. An electronic component according to claim 1, wherein said insulating layer comprises a frame-shaped member and is disposed on a cap-mounting portion of said substrate, and said conductive layer extends across and on top of the insulating layer disposed on said ground electrode.

6. An electronic component according to claim 1, wherein said insulating layer comprises a frame-shaped layer and is disposed on a cap-mounting portion of said substrate and said holes in said insulating layer are located at positions corresponding to locations of said ground electrode on said substrate, and said conductive layer is disposed on said ground electrode at locations corresponding to the openings of said insulating layer and has a greater thickness than said insulating layer.

7. An electronic component according to claim 1, wherein said electronic component device comprises a piezoelectric device including first and second electrodes which are respectively connected to the input and output electrodes of said substrate.

8. An electronic component according to claim 1, wherein said electronic component device comprises a piezoelectric device and a capacitor device bonded to each other, first and second electrodes disposed on said piezoelectric device, and two individual electrodes connected to the first and second electrodes of said piezoelectric device and disposed on one main surface of said capacitor device, an opposing electrode opposedly facing said individual electrodes is disposed on another main surface of said capacitor device, and the two individual electrodes disposed on said one main surface of said capacitor device are respectively connected to said input and output electrodes of said substrate, while the opposing electrode of said capacitor device is connected to the ground electrode of said substrate.

* * * * *